United States Patent
Tsai et al.

(10) Patent No.: US 6,703,763 B2
(45) Date of Patent: Mar. 9, 2004

(54) BULK ACOUSTIC WAVE MULTIPLEXER

(75) Inventors: Shu-Hui Tsai, Hsin-Chu (TW); Chengkuo Lee, Hsin-Chu (TW)

(73) Assignee: Asia Pacific Microsystems, Inc., Hsinchu (TW)

( * ) Notice: Subject to any disclaimer, the term of this patent is extended or adjusted under 35 U.S.C. 154(b) by 0 days.

(21) Appl. No.: 10/043,119

(22) Filed: Jan. 14, 2002

(65) Prior Publication Data

US 2002/0109430 A1 Aug. 15, 2002

(30) Foreign Application Priority Data

Jan. 12, 2001 (TW) .................................. 90100677 A

(51) Int. Cl.⁷ .............................. H01L 41/08; H03H 9/15
(52) U.S. Cl. ........................................ 310/318; 333/187
(58) Field of Search ........................... 310/318; 333/187, 333/205

(56) References Cited

U.S. PATENT DOCUMENTS 5,160,870 A * 11/1992 Carson et al. .............. 310/339
6,204,737 B1 * 3/2001 Ella ............................ 333/187

* cited by examiner

*Primary Examiner*—Thomas M. Dougherty
(74) *Attorney, Agent, or Firm*—Troxell Law Office PLLC

(57) ABSTRACT

A bulk acoustic wave multiplexer controlled by micro-electro-mechanical switches, it comprises: a substrate; a wave-filtering device disposed on the substrate; an input port disposed on one side of the wave-filtering device; an output port disposed on another side of the wave-filtering device; and micro-electro-mechanical switches disposed on the wave-filtering device for controlling the bulk acoustic wave multiplexer; the present invention provides a bulk acoustic wave multiplexer device having miniaturized size and less interference integrated with micro-electro-mechanical switch devices, so as to operate multiplexing function.

13 Claims, 6 Drawing Sheets

Fig. 3(a) Open state

Fig. 3(b) Close state

BULK ACOUSTIC WAVE MULTIPLEXER

FIELD OF THE INVENTION

The present invention relates to a bulk acoustic wave multiplexer device, and more particularly to a bulk acoustic wave multiplexer device having miniaturized size and less interference, and can be integrated with micro-electro-mechanical switch devices, so as to operate multiplexing function.

BACKGROUND OF THE INVENTION

The mobile communication is so vigorous development that speed up the requirement of the RF (radio frequency) wireless electronic device. The mobility of the wireless communication product is depended on the size of device and the lifetime of battery. In addition, the devices manufacturers are dedicated to develop the tiny, cheaper and the more well performance devices. The final step to miniaturize the device is to integrate it with the IC to form a system on chip (SOC). Presently, in the RF front-end of the wireless system, one of the devices that still can not be integrated with the IC, is RF front-end filter. In the future, the RF front-end filter will be the occupied space and the necessary device in the double, triple or multiple frequency standards. The multiplexer obtained by associating the RF switch with RF front-end filter would be the key to decide the communication quality. would be the key to decide the communication quality.

The RF front-end filter belongs to the surface acoustic filter is more ordinarily used. In the past, the surface acoustic wave filter is not only to be the RF front-end filter but also to be the channel selective filter in the IF (intermediate frequency) band. But to accompany with the development of the direct spread spectrum transformation technique (that is, the zero-IF or near zero-IF technique), it does not need any analog IF filter, so the application to the surface acoustic wave filter is extended to the RF filter. However, the surface acoustic wave filter itself has the larger insertion loss and it has worse power durability stand. In the past, it is not rigorous about the insertion loss standard in the use of the IF channel selective filter, and it belongs to the RF back-end so that it is not necessary to use a well power durability stand. Now, if it is used in the RF front-end, the above-mentioned both standards will be the problem to the surface acoustic wave filter.

DESCRIPTION OF THE PRIOR ART

Recently, the techniques of bulk acoustic wave multiplexer is used, such as the FBAR device (film bulk acoustic resonator) developed by the HP Company (refer to the U.S. Pat. No. 6,060,818), and the SBAR device (stack bulk acoustic resonator) developed by Nokia Company (refer to the U.S. Pat. No. 5,872,493), the volume of hi-efficiency products can be reduced, and can be operated within 400 MHz to 10 GHz. The duplexer for CDMA mobile phones is a kind of filtering device. The volume of the bulk acoustic wave duplexer is just as a small part of the ceramic duplexer. It is provided with better isolation, insertion loss, and power durability. Novel, mini wireless mobile communication devices having high efficiency can be manufactured by the manufacturers with the assembly of these properties.

FIG. 1 is a perspective showing a bulk acoustic wave multiplexer of the U.S. Pat. No. 5,185,589 of the Westinghouse Company in America. As shown in FIG. 1, in the whole wave-filtering multiplexer, a structure of multi-frequency division device is adopted, wherein numeral 10 indicates an input port of the bulk acoustic wave multiplexer that is enabled to receive signals and carrier waves with various frequencies. The dotted-line frames of numerals 11, 11', and 11" respectively indicate the bulk acoustic wave multiplexer with various frequency bands, and numerals 12, 12', and 12" indicate the output ports corresponding with various frequency bands.

SUMMARY OF THE INVENTION

According to the disadvantages of the above-mentioned conventional multiplexer, the object of the present invention is to provide a bulk acoustic wave multiplexer having a smaller volume, so as to integrate it onto a single chip.

According to the bulk acoustic wave multiplexer of the present invention, it provides a multi-bands multiplexer, and enables a decrease of the interference thereof. It is another object of the present invention.

According to the bulk acoustic wave multiplexer of the present invention, it enables a large decrease of the insertion loss and an increase of the isolation thereof It is again another object of the present invention.

According to the bulk acoustic wave multiplexer of the present invention and the manufacturing method thereof, it provides a bulk acoustic wave multiplexe that can be combined with the package, thus enables a smaller volume. It is a further object of the present invention.

In order to achieve the above-mentioned objects, the bulk acoustic wave multiplexer of the present invention can be combined with the micro-electro-mechanical switch and integrated on the same chip.

In order to achieve the above-mentioned objects, combining with a bulk acoustic wave filter, the bulk acoustic wave multiplexer of the present invention can be coupled to several ports, thus a low-loss multi-channel multiplexer is achieved.

In order to achieve the above-mentioned objects, the bulk acoustic wave multiplexer of the present invention can be further combined with a bulk acoustic wave filter and a micro-electro-mechanical switch-controlling multi-channel multiplexer, thus the noises between the channels is lowered.

In order to achieve the above-mentioned objects, while manufacturing the bulk acoustic wave multiplexer of the present invention, the chip level package containing micro-electro-mechanical switch can be used for lowering the complication of the manufacturing process.

The present invention will be better understood and its numerous objects and advantages will become apparent to those skilled in the art by referencing to the following drawings.

BRIEF DESCRIPTION OF THE DRAWINGS

FIGS. 3a and 3b are sectional views showing the "on" and "off" states of the bulk acoustic wave filter controlled by using the micro-electro-mechanical switch according to the present invention.

DETAILED DESCRIPTION OF THE PREFERRED EMBODIMENT

Figure 1:
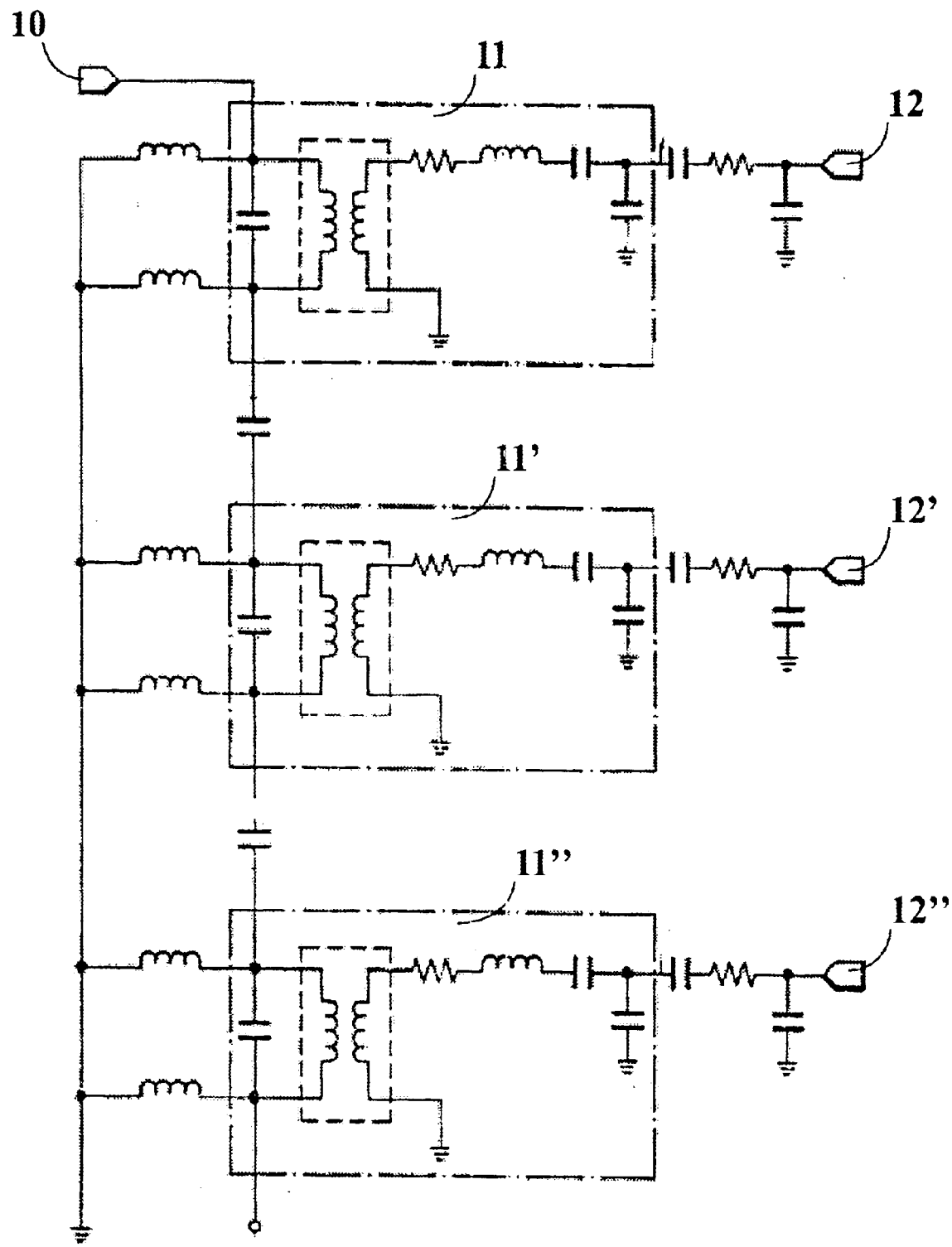
FIG. 1 shows the construction of the bulk acoustic wave multiplexer in prior art.

The FIG. 1 is the conventional skill relating to the bulk acoustic wave multiplexer that has been described above; it is not repeated here.

Figure 2:
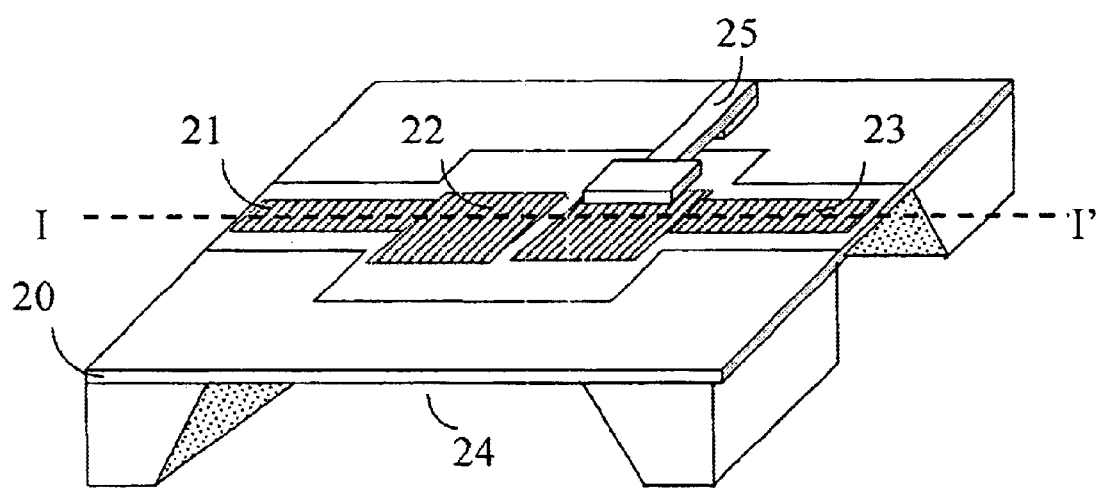
FIG. 2 is a perspective view showing that the bulk acoustic wave filter is controlled by using the micro-electro-mechanical switch according to the present invention.

FIG. 2 is a perspective view showing the present invention using the micro electromechanical switch to control the bulk acoustic wave filter. As shown in the figure, wherein numeral 20 indicates a substrate; 22 indicates a wave-filtering device; 24 indicates a cavity; 21 indicates an input terminal of the wave-filtering device; 23 indicates an output terminal of the wave-filtering device; and 25 indicates a micro-electro-mechanical switch for controlling the bulk acoustic wave filter. Generally, the micro-electro-mechanical switch is used as a RF switch. It functions as changing the equivalent impedance of the transmission line by driving the micro actuator far and near the transmission line; so, it can generate an extremely high or extremely low insertion loss according to the RF signals. Thus, it achieves operating as a RE switch. In the present invention, however, as the micro-electro-mechanical swich applied in the bulk acoustic wave filter, since the micro-electro-mechanical swich is contacted with the upper electrode, larger acoustic wave impedance is generated. Thus, the oscillation of the bulk acoustic wave-filtering device is restrained. Meanwhile, the acoustic wave impedance $Z=\rho V$, wherein $\rho$ is the density of the medium for acoustic wave, and V is the velocity of the acoustic wave.

Figure 3C:
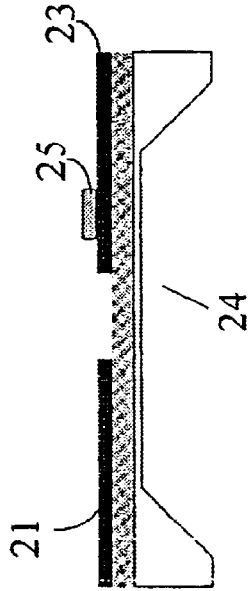
FIGS. 3c and 3d are responding views showing the frequencies according to the "on" and "off" states of the bulk acoustic wave filter controlled by using the micro-electromechanical switch according to the present invention.
Figure 3C:
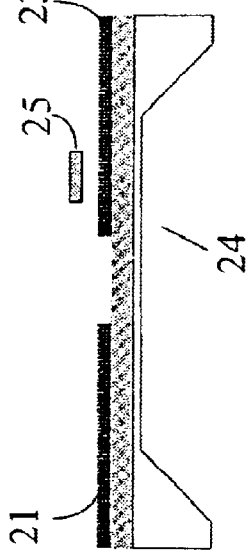
Figure 3C:
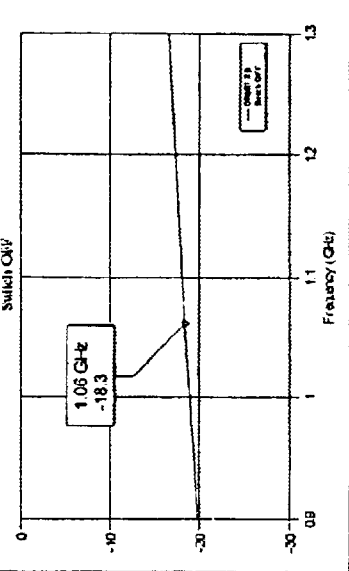
Figure 3D:
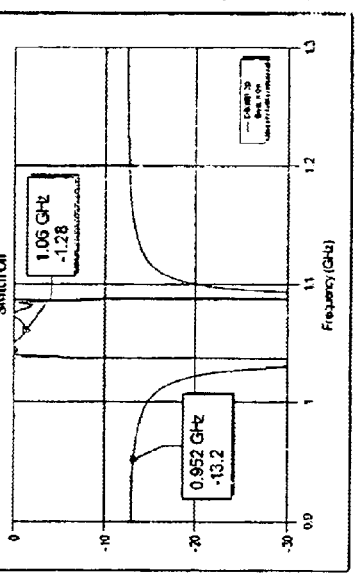

FIGS. 3a and 3b are perspective views showing the "on" and "off" states of the bulk acoustic wave filter controlled by using the micro-electro-mechanical switch according to the present invention. FIGS. 3c and 3d are responding views showing the frequencies according to the "on" and "off" states of the bulk acoustic wave filter controlled by using the micro-electro-mechanical switch according to the present invention. It is known from the figures, the RF signal has extremely low insertion loss initially; once the micro-electro-mechanical switch is contacted with the upper electrode of the bulk acoustic wave filter, the insertion loss becomes rather large immediately.

There is an advantage of using this combination of the micro-electro-mechanical switch and bulk acoustic wave-filtering device. If the micro-electro-mechanical switch is simply used for disconnecting the transmission line from operating, while the switch is on, it must be distanced from the transmission line for 2 to 3 $\mu$m; thus, it is ensured that the RF signal is not interfered, and the insertion loss is increased or the isolation is lowered. But, in order to generate an enabling distance of 2 to 3 $\mu$m by the micro-electro-mechanical switch, the driving voltage must be heightened, and the switching velocity must be lowered. Nevertheless, if applying the micro-electro-mechanical switch of the present invention to controll the bulk acoustic wave filter, the initial location of the micro-electro-mechanical switch can be lowered to less than 1 $\mu$m, thus the driving voltage is lowered greatly, and the switching speed is risened. That is, the switch shows its function only when the micro-electro-mechanical switch is indeed contacted with the upper electrode of the bulk acoustic wave filter. So, even if the initial location is very close, while it is not contacted with the upper electrode of the bulk acoustic wave filter, there is no any effect to the frequencies. Therefore, the problems of electromagnetic interference generated by a general micro-electro-mechanical switch in such short distance can be solved. There is another advantege of the present invention. It is not necessary to deal with the isolation between the DC controlling voltage applied to the micro-electro-mechanical switch and the RF signal of the bulk acoustic wave. It is because the capacitance is included in the equivalent circuit of the bulk acoustic wave filter, so it can be used as a TO blocking capacitor for preventing the DC power source from entering the RF power source.

The micro-electro-mechanical switches can be driven by any actuating methods, including electrostatic driving, thermal-electrical driving, or piezoelectrical driving.

To achieve this function with a conventional micro-electro-mechanical switch, an insulated layer or an additional series-connecting capacitance is required. It can be omitted in the micro-electro-mechanical switch of the present invention. Besides, the upper electrode of the bulk acoustic wave filter can be provided as the driving electrode of the micro-electro-mechanical switch. Therefore, considering entirely, the best volume and efficiency can be achieved, and the manufacturing process is not too complicated. And more particularly, it gives a good account of itself in the RF functions and standards of the RF switch, and the standards of the driving speed and voltage of the actuator.

Figure 4:
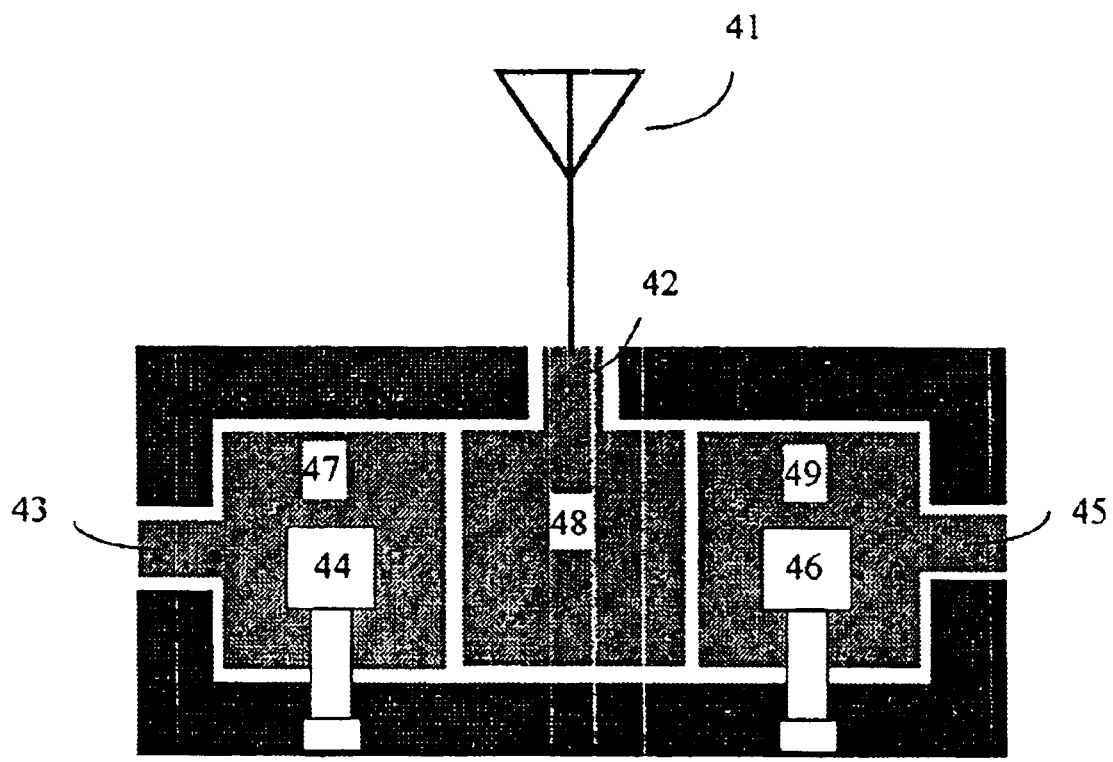
FIG. 4 is a perspective view showing the bulk acoustic wave multiplexer for the transmit-receive terminal of an antenna according to the first embodiment of the present invention.

FIG. 4 is a perspective view showing the bulk acoustic wave-filtering multiplexer for the transmit-receive terminal of an antenna according to the first embodiment of the present invention. As shown in FIG. 4, this bulk acoustic wave multiplexer includes an antenna 41, an antenna terminal output/input port 42, micro-electro-mechanical switches 44 and 46, and input ports 43 and 45. The signals from the antenna 41 are transferred into the input port 42; by switching off the micro-electro-mechanical switch 44 and switching on the switch 46, the signals are controlled to enter the receiving input port 45, then, enter the next step of the low noises amplifying (LNA) circuit. Similarly, by switching on the micro-electro-mechanical switch 44 and switching off the switch 46, the signals can be controlled to enter the transmitting terminal 42 from the input port 43, and the signals are transmitted by the antenna 41.

Figure 5:
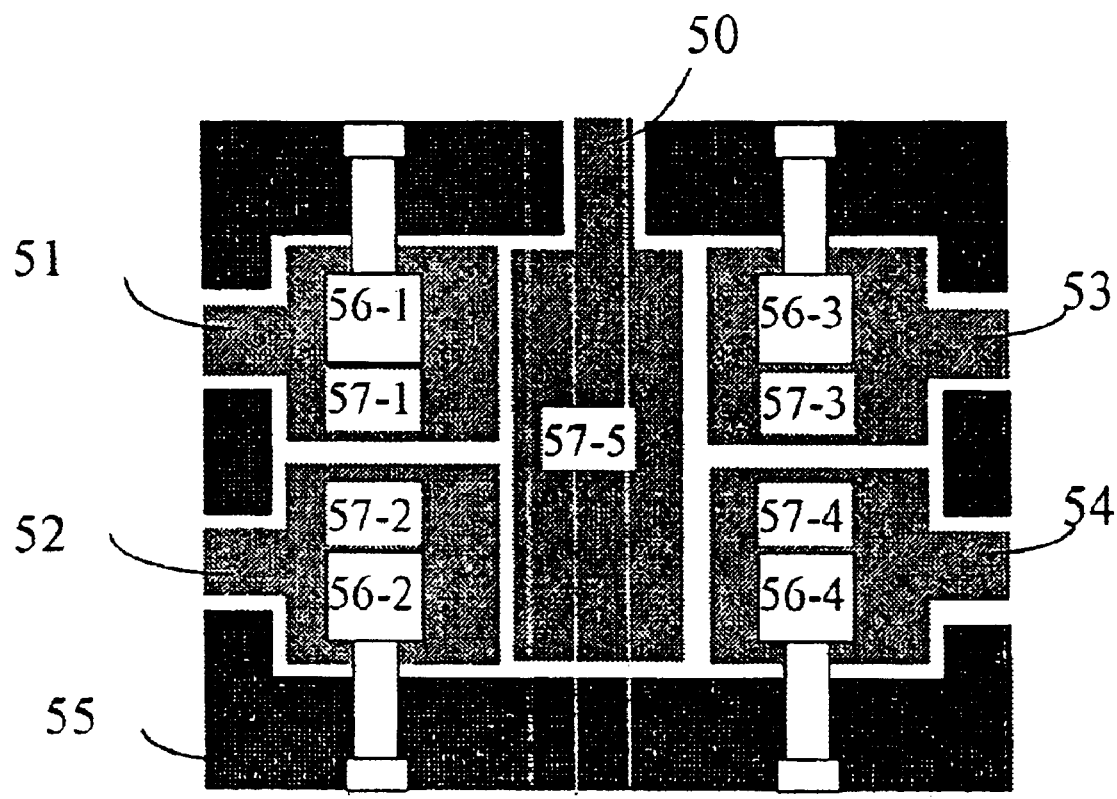
FIG. 5 is a perspective view showing the bulk acoustic wave multiplexer for multi-channel according to the second embodiment of the present invention.

FIG. 5 is a perspective view showing the bulk acoustic wave multiplexer for multi-channel according to the second embodiment of the present invention. As shown in FIG. 5, this bulk acoustic wave multiplexer includes an output/input port 50, micro-electro-mechanical switches 56, 57, 58, and 59, and output ports 51, 52, 53, and 54. The signals are inputted from the output/input port 50, then, under the control of the micro-electro-mechanical switches 56, 57, 58, 59, the signals are outputted. Thus, the function of multi-plexing is achieved. Wherein, the wave-filter devices controlled respectively by the micro-electro-mechanical switches 56, 57, 58, 59 may be different channels with same frequency, or may be channels with various frequencies.

Figure 6:
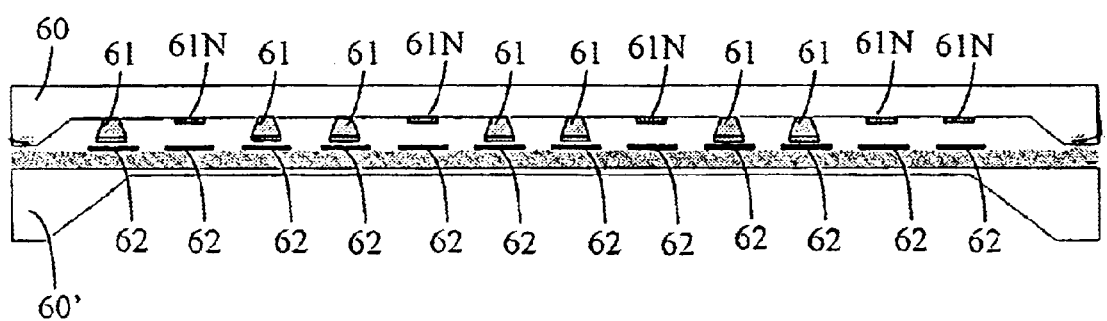
FIG. 6 is a perspective view showing the bulk acoustic wave-filtering multiplexer for multi-channel combining with the package with a switch according to the third embodiment of the present invention.

FIG. 6 is a perspective view showing the bulk acoustic wave multiplexer for multi-channel combining with the package with a switch according to the third embodiment of the present invention. As shown in FIG. 6, this bulk acoustic wave multiplexer includes a switched-on micro-electro-mechanical switch 61, and a switched-off micro-electro-mechanical switch 61N. The signals of each wave-filtering unit 62 can be controlled by these micro-electro-mechanical switches, thus, the function of multiplexing is achieved. Wherein, the wave-filtering devices controlled respectively by the micro-electro-mechanical switches 61 and 61N may be different channels with same frequency, or may be channels with various frequencies.

After these micro-electro-mechanical switches 61 and 61N have been proceeded with different wafer process, by the method of flip-chip or CSP (chip scale package), the upper substrate 60, including the driving circuit (not shown) and the micro-electro-mechanical switch, is combined with the lower substrate 60', including the wave-filtering unit 62. There are advantages of this embodiment example; that is, the complication of the process combining with the package can be reduced greatly, and the structure of the wave-filtering unit is secured. On the other hands, the driving micro-electro-mechanical switch can be integrated by CMOS circuit, and thus, a multiplexing selector with more complicated functions can be provided.

Although the present invention has been described using specified embodiment, the examples are meant to be illustrative and not restrictive. It is clear that many other variations would be possible without departing from the basic approach, demonstrated in the present invention.

What is claimed is:

1. A bulk acoustic wave multiplexer controlled by micro-electro-mechanical switches, it comprises:
   an upper substrate;
   micro-electro-mechanical switches and driving circuits formed on the upper substrate;
   a lower substrate;
   wave-filtering units and connecting circuits formed on the lower substrate;
   wherein, the upper and lower substrates are connected together to form a bulk acoustic wave multiplexer controlled by micro-electro-mechanical switches.

2. The bulk acoustic wave multiplexer as claimed in claim 1, wherein the upper and lower substrates are connected by flip-chip or CSP (chip scale package).

3. The bulk acoustic wave multiplexer as claimed in claim 2, wherein the driving circuits for driving the micro-electromechanical switches are CMOS circuits.

4. A bulk acoustic wave filter controlled by micro-electro-mechanical switches comprising:
   a) a substrate;
   b) at least one wave filtering device connected to the substrate, the wave filtering device having an Input terminal and an output terminal, the input terminal and the output terminal being at opposite ends of the wave filtering device; and
   C) at least one micro-electro-mechanical switch releasably engaging the wave filtering device, such that the bulk acoustic wave filter is switched off when the at least one micro-electro-mechanical switch is in contact with the wave filtering device and switched on when the at least one micro-electro-mechanical switch is separated from the wave filtering device,
   wherein the at least one wave filtering device and the at least one micro-electro-mechanical switch are connected to a first side of the substrate opposite a cavity on a second side of the substrate, the at least one micro-electro-mechanical switch controls the acoustic wave impedance generated by the bulk acoustic wave filter.

5. The bulk acoustic wave filter controlled by micro-electromechanical switches according to claim 4, wherein the at least one micro-electro-mechanical switch being separated from the wave filtering device a distance less than 1 µm when the bulk acoustic wave filter is switched on.

6. The bulk acoustic wave filter controlled by micro-electro-mechanical switches according to claim 4, wherein the at least one micro-electro-mechanical switch is driven by an actuating method selected from the group consisting of electrostatic driving, thermal-electrical driving, and piezo-electrical driving.

7. The bulk acoustic wave filter controlled by micro-electro-mechanical switches according to claim 4, further comprising:
   a) an antenna;
   b) an antenna terminal output/input port connected to the antenna;
   c) a plurality of input ports;
   d) at least one wave filtering device being a plurality of wave filtering devices; and
   e) the at least one micro-electro-mechanical switch being a plurality of micro-electro-mechanical switches releasably engaging the plurality of input ports of the plurality of wave filtering devices and the antenna terminal output/input port.

8. The bulk acoustic wave filter controlled by micro-electro-mechanical switches according to claim 7, wherein the plurality of micro-electro-mechanical switches control when signals from the antenna are transmitted from the antenna terminal output/input port to the plurality of input ports.

9. The bulk acoustic wave filter controlled by micro-electro-mechanical switches according to claim 7, wherein the plurality of micro-electro-mechanical switches control when signals from the plurality of input ports are transmitted to the antenna terminal output/input port to be transmitted by the antenna.

10. The bulk acoustic wave filter controlled by micro-electro-mechanical switches according to claim 7, further comprising:
    a) an input/output port;
    b) a plurality of output ports:
    c) the plurality of micro-electro-mechanical switches being four micro-electro-mechanical switches; and
    d) the plurality of wave filtering devices being four wave filtering devices releasably engaging the input/output port and the plurality of output ports.

11. The bulk acoustic wave filter controlled by micro-electro-mechanical switches according to claim 10, wherein signals received by the input/out port are controlled by the plurality of micro-electromechanical switches and filtered by the wave filtering devices before being output through the output ports.

12. The bulk acoustic wave filter controlled by micro-electro-mechanical switches according to claim 10, wherein the wave filtering devices are different channels with the same frequency.

13. The bulk acoustic wave filter controlled by micro-electro-mechanical switches according to claim 10, wherein the wave filtering devices are different channels with the different frequencies.

* * * * *